(12) United States Patent
Mizumura (10) Patent No.: US 10,035,162 B2
(45) Date of Patent: Jul. 31, 2018

(54) DEPOSITION MASK FOR FORMING THIN-FILM PATTERNS

(71) Applicant: V TECHNOLOGY CO., LTD., Kanagawa (JP)

(72) Inventor: Michinobu Mizumura, Yokohama (JP)

(73) Assignee: V TECHNOLOGY CO., LTD. (JP)

( * ) Notice: Subject to any disclaimer, the term of this patent is extended or adjusted under 35 U.S.C. 154(b) by 0 days.

(21) Appl. No.: 14/439,309

(22) PCT Filed: Jul. 18, 2013

(86) PCT No.: PCT/JP2013/069461
§ 371 (c)(1),
(2) Date: Apr. 29, 2015

(87) PCT Pub. No.: WO2014/069049
PCT Pub. Date: May 8, 2014

(65) Prior Publication Data
US 2015/0290667 A1    Oct. 15, 2015

(30) Foreign Application Priority Data

Oct. 30, 2012    (JP) .................................. 2012-238956

(51) Int. Cl.
*H01L 21/033* (2006.01)
*B05B 12/20* (2018.01)
(Continued)

(52) U.S. Cl.
CPC ............ *B05B 12/20* (2018.02); *B05C 21/005* (2013.01); *H01L 21/0332* (2013.01);
(Continued)

(58) Field of Classification Search
CPC . C23C 14/042; B05C 21/005; H01L 51/0011; H01L 51/5012; H01L 21/0268;
(Continued)

(56) References Cited

U.S. PATENT DOCUMENTS 3,962,002 A * 6/1976 Finkbeiner ............... B41J 2/395
216/100
6,858,086 B2 * 2/2005 Kang .................... C23C 14/042
118/504
(Continued)

FOREIGN PATENT DOCUMENTS

JP    2004183023 A    7/2004
JP    2004183024 A    7/2004
(Continued)

OTHER PUBLICATIONS

International Search Report for Application No. PCT/JP2013/069461 dated Sep. 24, 2013.
(Continued)

*Primary Examiner* — Karl Kurple
(74) *Attorney, Agent, or Firm* — Lerner, David, Littenberg, Krumholz & Mentlik, LLP (57) ABSTRACT

The present invention provides a deposition mask for forming a thin-pattern by depositing a deposition material on a substrate, the deposition mask includes: a thin plate-shaped magnetic metal member 1 in which a through-hole 4 having shape and dimensions greater than those of the thin-film pattern is provided at a position corresponding to the thin-film pattern; and a resin film 2 which is provided in close contact with one surface of the magnetic metal member 1 and in which an opening pattern 5 having shape and dimensions identical to those of the thin-film pattern is formed at a position corresponding to the thin-film pattern in the through-hole 4, the resin film 2 being permeable to visible light. The opening pattern 5 is provided within an opening pattern formation region 7 surrounded by a deposition shadow region 6 defined by the thickness of the magnetic metal member 1 and the maximum angle of incidence of the deposition material to the film surface in the through-hole 4.

5 Claims, 5 Drawing Sheets (51) Int. Cl.
  *B05C 21/00* (2006.01)
  *H01L 51/00* (2006.01)
  *C23C 16/04* (2006.01)
  *B05D 1/32* (2006.01)
  *C23C 14/04* (2006.01)
(52) U.S. Cl.
  CPC .............. *H01L 51/001* (2013.01); *B05D 1/32* (2013.01); *C23C 14/042* (2013.01); *C23C 16/042* (2013.01)
(58) Field of Classification Search
  CPC ............. H01L 21/0332; H01L 21/0334; H01L 21/0338; H01L 21/32
  USPC ................................................ 216/17, 22, 12
  See application file for complete search history.

(56) References Cited

U.S. PATENT DOCUMENTS

| | | | | |
|---|---|---|---|---|
| 7,537,798 | B2* | 5/2009 | Shigemura | H01L 51/0004 118/721 |
| 7,618,674 | B2* | 11/2009 | Kang | H01L 27/3211 118/721 |
| 7,918,705 | B2* | 4/2011 | Lee | H01L 51/0011 313/504 |
| 8,404,125 | B2* | 3/2013 | Matsudate | C23C 14/042 118/504 |
| 8,459,526 | B2* | 6/2013 | Hong | G03F 7/12 219/121.6 |
| 8,746,169 | B2* | 6/2014 | Lee | C23C 14/042 118/504 |
| 8,841,142 | B2* | 9/2014 | Kawato | C23C 14/042 118/504 |
| 8,907,445 | B2* | 12/2014 | Sonoda | H01L 51/0011 257/40 |
| 9,263,707 | B2* | 2/2016 | Ko | H01L 51/56 |
| 9,362,501 | B2* | 6/2016 | Hsu | C23C 14/12 |
| 9,394,600 | B2* | 7/2016 | Han | B05C 21/005 |
| 9,496,808 | B2* | 11/2016 | Bishop | B05B 15/045 |
| 2002/0025406 | A1* | 2/2002 | Kitazume | B32B 3/10 428/136 |
| 2003/0101932 | A1* | 6/2003 | Kang | C23C 14/042 118/504 |
| 2004/0115342 | A1* | 6/2004 | Shigemura | H01L 51/0011 427/143 |
| 2005/0130422 | A1* | 6/2005 | Theiss | C23C 14/042 438/689 |
| 2007/0178708 | A1* | 8/2007 | Ukigaya | C23C 14/044 438/758 |
| 2008/0314743 | A1* | 12/2008 | Lee | C23C 14/042 204/298.11 |
| 2011/0027461 | A1* | 2/2011 | Matsudate | C23C 14/042 427/67 |
| 2013/0299810 | A1* | 11/2013 | Sonoda | H01L 51/0011 257/40 |

FOREIGN PATENT DOCUMENTS

| | | | |
|---|---|---|---|
| JP | 2004190057 A | 7/2004 | |
| JP | 2004232026 A | 8/2004 | |
| JP | 2007035336 A | 2/2007 | |
| JP | 2008121060 A | 5/2008 | |
| JP | 2009068082 A | 4/2009 | |
| JP | 2009249706 A | 10/2009 | |
| JP | WO 2012090770 A1 * | 7/2012 | .......... H01L 51/0011 |

OTHER PUBLICATIONS

Chinese Office Action dated Jul. 26, 2016 in Appln. No. 201380057122.8 and its English translation.
Japanese Office Action dated Aug. 9, 2016 in Appln. No. 2012-238956 and its partial English translation.
Chinese Office Action for Appln. No. CN 201380057122.8 dated Apr. 19, 2017.
Japanese Office Action dated Jan. 10, 2017, in Japanese Application No. 2012-238956 and its partial English Translation.
Taiwanese Office Action for Application No. 102139001 dated Jan. 10, 2017.
Chinese Office Action dated Jan. 20, 2017 in Appln. No. 201380057122.8.
Chinese Office Action dated Jul. 24, 2017 in Application No. 201380057122.8 and its partial English translation.

* cited by examiner

DEPOSITION MASK FOR FORMING THIN-FILM PATTERNS

CROSS-REFERENCE TO RELATED APPLICATION

This application is a national phase entry under 35 U.S.C. § 371 of International Application No. PCT/JP2013/069461, filed Jul. 18, 2013, which claims priority to Japanese Patent Application No. 2012-238956, filed Oct. 30, 2012, the disclosures of which are incorporated herein by reference.

BACKGROUND OF THE INVENTION

1. Field of the Invention

The present invention relates to a deposition mask, and more particularly, relates to a deposition mask that makes it possible to deposit a thin-film pattern having a uniform thickness by eliminating effects on film formation by a deposition shadow that is caused by the edge of an opening through which a deposition material passes.

2. Description of Related Art

A conventional deposition mask is formed of three metal layers including a thin opening pattern formation layer, a relatively thick support layer, and a bonding layer for bonding the opening pattern formation layer and the support layer, the opening pattern formation layer, support layer and bonding layer being etched to form a through-opening that extends through these layers (see, for example, JP 2004-183024 A).

In this case, the opening pattern formation layer and the support layer are etched using different resist patterns, the opening pattern formation layer is provided with an opening pattern having a minimum width, and the support layer is provided with a through-hole having a width greater than that of the opening pattern.

However, in such a conventional deposition mask, an opening pattern is formed in a through-hole without considering effects on film formation by a deposition shadow that is defined by the thickness of a support layer and the maximum angle of incidence of a deposition material to a mask surface. Accordingly, if the alignment of resist patterns that form the opening pattern and the through-hole deviates, the opening pattern may be partially caught in the deposition shadow part, so that a thin-film pattern having a uniform film thickness cannot be formed on a substrate.

Thus, for coping with the abovementioned problem, the present invention provides a deposition mask that makes it possible to deposit a thin-film pattern having a uniform thickness by eliminating effects on film formation by a deposition shadow that is caused by the edge of an opening through which a deposition material passes.

SUMMARY OF THE INVENTION

For achieving the object described above, a deposition mask according to a first aspect is a deposition mask for forming a thin-film pattern by depositing a deposition material on a substrate, the deposition mask including: a thin plate-shaped magnetic metal member in which a through-hole having shape and dimensions greater than those of the thin-film pattern is provided at a position corresponding to the thin-film pattern; and a resin film which is provided in close contact with one surface of the magnetic metal member and in which an opening pattern having shape and dimensions identical to those of the thin-film pattern is formed at a position corresponding to the thin-film pattern in the through-hole, the resin film being permeable to visible light. The opening pattern is provided within an opening pattern formation region surrounded by a deposition shadow region that is defined by the thickness of the magnetic metal member and the maximum angle of incidence of the deposition material to the film surface in the through-hole.

A deposition mask according to a second aspect is a deposition mask for forming a plurality of thin-film patterns with the thin-film patterns arranged at fixed array pitches by depositing a deposition material on a substrate, the deposition mask including: a thin plate-shaped magnetic metal member that has through-holes arranged at the same array pitches as those of the thin-film patterns and having shape and dimensions greater than those of the thin-film pattern; and a resin film which is provided in close contact with one surface of the magnetic metal member and in which opening patterns having shape and dimensions identical to those of the thin-film pattern are each formed at a position corresponding to the thin-film pattern in the through-hole, the resin film being permeable to visible light. The opening pattern is provided within an opening pattern formation region surrounded by a deposition shadow region that is defined by the thickness of the magnetic metal member and the maximum angle of incidence of the deposition material to the film surface in the through-hole.

In this case, it is preferable that the width of the opening pattern formation region in the same direction as the arrangement direction of the through-holes be equal to a value obtained by adding a value that is twice as large as a tolerance value of positional deviation of the opening pattern in the same direction as the arrangement direction of the through-holes, to at least the width of the opening pattern in the same direction.

It is more preferable that the width in the arrangement direction of the through-holes be equal to a value obtained by adding a value that is twice as large as the width of the deposition shadow region in the same direction as the arrangement direction of the through-holes, to the width of the opening pattern formation region in the same direction as the arrangement direction of the through-holes.

Preferably, the magnetic metal member is made of nickel, a nickel alloy, Invar, or an Invar alloy.

Preferably, the film is made of polyimide.

Furthermore, it is preferable that one end surface of a frame provided with an opening sized to include the through-hole be bonded to a peripheral edge region of one surface of the magnetic metal member.

According to the present invention, a thin-film pattern having a uniform thickness can be deposited by eliminating effects on film formation by a deposition shadow that is caused by the edge of a through-hole of a magnetic metal member. Therefore, for example when an organic EL layer is formed on an organic EL display panel by deposition, an organic EL layer having uniform film thickness can be formed, so that uniform light emitting characteristics can be obtained over the entire surface of the display panel.

DESCRIPTION OF PREFERRED EMBODIMENT

Figure 1:
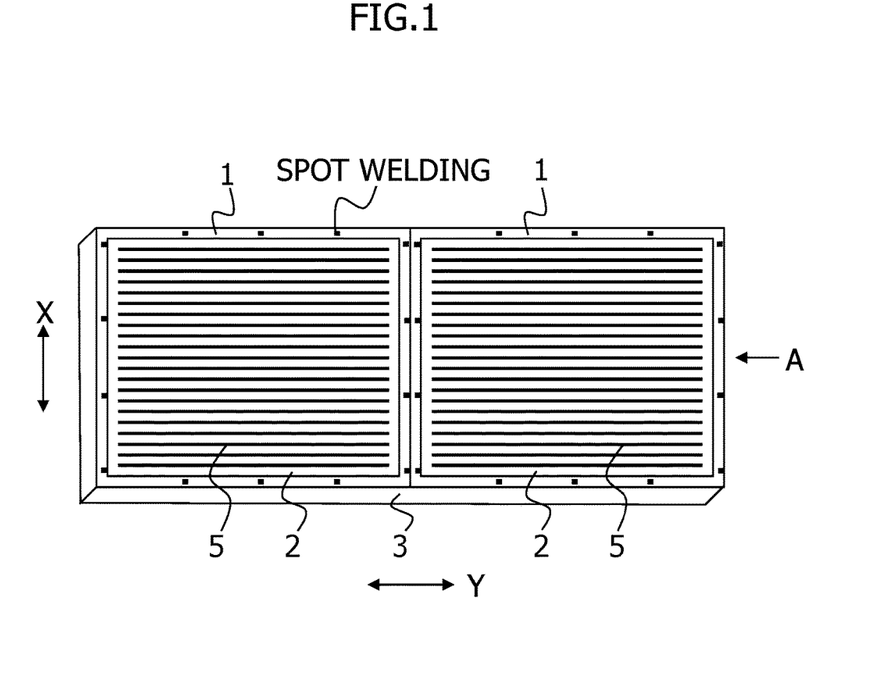
FIG. 1 is a perspective view illustrating an embodiment of a deposition mask according to the present invention.
Figure 2:
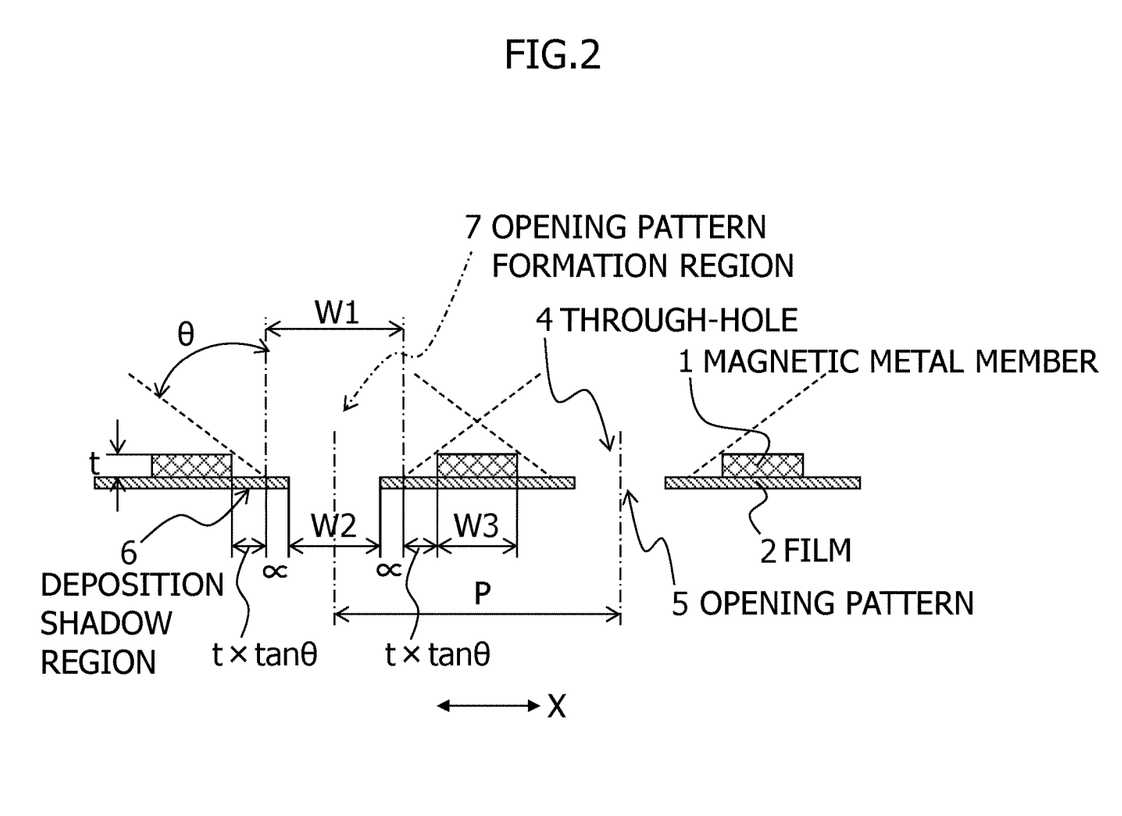
FIG. 2 is a cross section viewed from arrow A, illustrating a part of FIG. 1, which is enlarged and inverted.

An embodiment of the present invention will be described in detail below with reference to the accompanying drawings. FIG. 1 is a perspective view illustrating an embodiment of a deposition mask according to the present invention, and FIG. 2 is a cross section viewed from arrow A, illustrating a part of FIG. 1, which is enlarged and inverted. The deposition mask is intended for forming a plurality of thin-film patterns with the thin-film patterns arranged at fixed array pitches by depositing a deposition material on a substrate, and includes a magnetic metal member 1, a film 2, and a frame 3.

The magnetic metal member 1 is in the form of a thin plate (sheet) made of a magnetic metal material having a thickness of about 30 μm to 50 μm, such as nickel, a nickel alloy, Invar, or an Invar alloy, and is provided with through-holes 4 arranged at the same array pitches as those of the thin-film patterns and having shape and dimensions greater than those of the thin-film pattern.

The film 2 is provided in close contact with one surface of the magnetic metal member 1. The film 2 is a resin film that has a thickness of about 10 μm to 30 μm and is permeable to visible light, such as that of polyimide or polyethylene terephthalate (PET), and in the film 2, through-opening patterns 5 having shape and dimensions identical to those of the thin-film pattern are each formed at a position corresponding to the thin-film pattern in the through-hole 4 of the magnetic metal member 1.

In this case, the opening pattern 5 is formed within an opening pattern formation region 7 surrounded by a deposition shadow region 6 (t×tan θ) that is defined by the thickness t of the magnetic metal member 1 and the maximum angle θ of incidence of a deposition material to the surface of the film 2 in the through-hole 4 as shown in FIG. 2.

Here, it is preferable that the width W1 of the opening pattern formation region 7 in the same direction as the arrangement direction (X direction shown in FIG. 2) of the through-holes 4 is equal to a value (W2+2∝) obtained by adding a value that is twice as large as a tolerance value ∝ of positional deviation of the opening pattern 5 in the same direction as the arrangement direction (X direction) of the through-holes 4, to at least the width W2 of the opening pattern 5 in the same direction. That is, it is desirable to satisfy the relationship W1≥(W2+2∝).

For ensuring that the width W1 of the opening pattern formation region 7 in the X direction is equal to a value (W2+2∝) obtained by adding a value that is twice as large as a tolerance value ∝ of positional deviation of the opening pattern 5 in the X direction, to at least the width W2 of the opening pattern 5 in the same direction, at least one of the thickness t of the magnetic metal member 1 and the width W3 of an area between adjacent through-holes 4 of the magnetic metal member 1 in the adjacency direction (X direction) should be adjusted.

More specifically, when there is a sufficiently large distance between mutually adjacent opening patterns 5, it is preferred that the thickness t of the magnetic metal member 1 be set to a thickness that allows sufficient stiffness to be secured, and the width W3 of an area between adjacent through-holes 4 of the magnetic metal member 1 in the X direction is then determined so that the width W1 in the X direction of the opening pattern formation region 7 surrounded by the deposition shadow region 6 is equal to (W2+2∝).

Conversely, when there is not a sufficiently large distance between mutually adjacent opening patterns 5, it is preferred that the width W3 of an area between adjacent through-holes 4 of the magnetic metal member 1 in the X direction be first set, and the deposition shadow region 6 is then adjusted by determining the thickness t of the magnetic metal member 1 so that the width W1 of the opening pattern formation region 7 in the X direction is equal to at least (W2+2∝).

In this way, the thickness t of the magnetic metal member 1 and the width W3 of the area between adjacent through-holes 4 in the X direction are appropriately set according to the array pitch P (equal to the array pitch of thin-film patterns) of opening patterns 5 to be formed.

The frame 3 provided with an opening 8 sized to include a plurality of through-holes 4 (see FIG. 3D) is provided on a peripheral edge region of one surface of the magnetic metal member 1 with an end surface 3a of the frame 3 bonded to the region. The frame 3 supports, under tension, the magnetic metal member 1 and film 2, and is formed of Invar or an Invar alloy having a thickness of several mm to several tens of mm and has a small thermal expansion coefficient.

Production of a deposition mask thus configured will now be described. Here, the deposition mask to be produced has the following specifications.

Specifications of Deposition Mask
    Opening width of opening pattern 5 (stripe pattern): W2
    Array pitch of opening pattern 5: P
    Tolerance value of positional deviation of opening pattern 5: ∝

In the following descriptions, the maximum angle of incidence of a deposition material to a mask surface is θ, and the magnetic metal member 1, the thickness t of which is defined beforehand, is used.

Figure 3A:
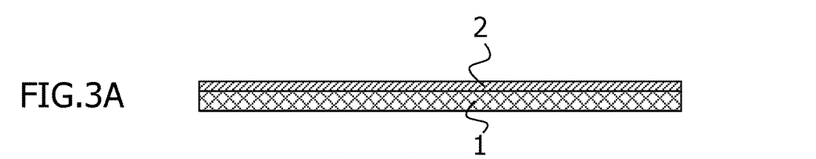
FIGS. 3A to 3E are views for explaining production of the deposition mask according to the present invention, which are sectional views illustrating steps before formation of an opening pattern.

First, for example a liquid polyimide is applied by spraying on one surface of the magnetic metal member 1 made of sheet-shaped Invar having a thickness t, and is then dried to form the film 2 of polyimide having a uniform thickness (see FIG. 3A).

Figure 3B:
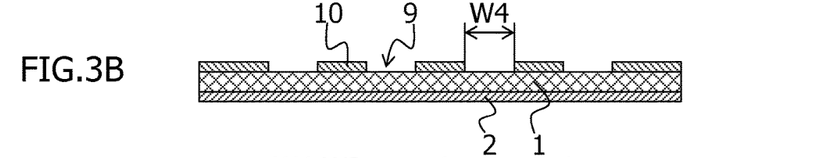

Then, for example, a positive photoresist is applied to the other surface of the magnetic metal member 1, and is dried, and the photoresist is exposed to light while a photomask having an opening is used at an area to be provided with, for example, the through-hole 4. Thereafter, the photoresist is developed, so that a resist mask 10 having an opening 9 is formed on an area to be provided with the through-hole 4 (see FIG. 3B).

In this case, the width W1 of the opening pattern formation region 7 is (W2+2∝) as calculated based on the specifications of the deposition mask. Since the thickness of the magnetic metal member 1 is t, and the maximum angle of incidence of the deposition material to the mask surface is θ, the width of the deposition shadow region 6 is t×tan θ. Therefore, the width W4 of the through-hole 4 to be formed on the magnetic metal member 1 is W4=W1+2t×tan θ=W2+

$2\alpha+2t\times\tan\theta$. Therefore, the opening 9 of the resist mask 10 has a stripe pattern having a width W4.

Subsequently, the magnetic metal member 1 is etched using the resist mask 10. Stripe-shaped through-holes 4 extending to the surface of the film 2 and having a width W4 are hereby formed on the magnetic metal member 1 at array pitches P (see FIG. 3C). Here, an etchant to be used is appropriately selected according to the material of the magnetic metal member 1.

Figure 3C:
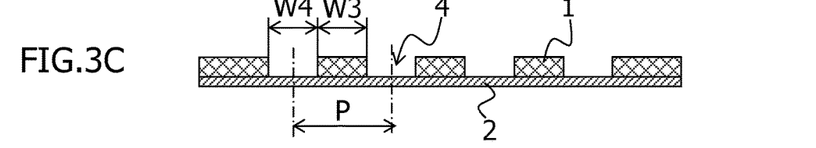

In this case, the width W3 of the area between adjacent through-holes 4 is $W3=P-W4=P-W2-2(\alpha+t\times\tan\theta)$.

Figure 3D:
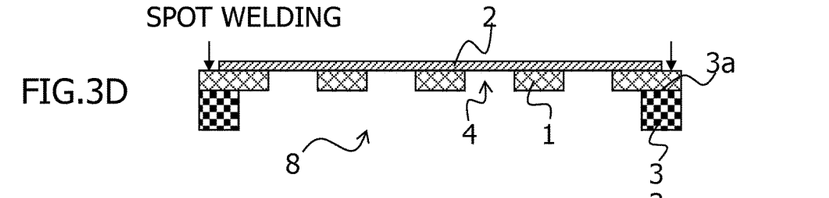

Thereafter, a part of the film 2 that corresponds to the peripheral edge region of the magnetic metal member 1 is removed by laser processing to expose the part of the peripheral edge region of the magnetic metal member 1, the magnetic metal member 1 with the film 2 is then provided under tension on the end surface 3a of the frame 3, and the peripheral edge part of the magnetic metal member 1 and the end surface 3a of the frame 3 are spot-welded to each other to bond the frame 3 to the magnetic metal member 1 (see FIG. 3D).

Figure 3E:
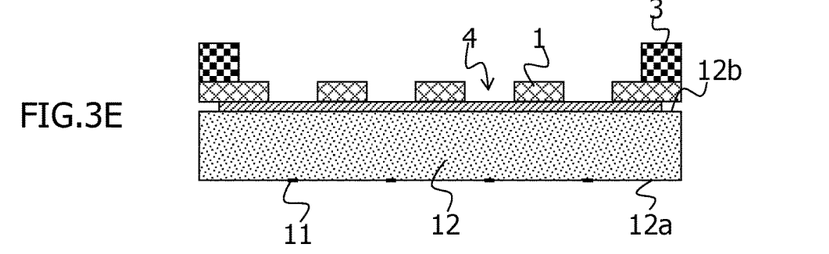

Next, the magnetic metal member 1 with the film 2, which is provided with the through-holes 4, is positioned and placed on a reference substrate 12 provided beforehand with a reference pattern 11 as a target for formation of the opening pattern 5. At this time, the magnetic metal member 1 is placed on the reference substrate 12 with the film 2 situated on the reference substrate 12 side (see FIG. 3E). It is preferred that the reference substrate 12 be disposed such that a surface 12a provided with the reference pattern 11 is on the lower side, and the film 2 is brought into close contact with a surface 12b on a side opposite to the surface 12a. The reference pattern 11 can be prevented from being damaged at the time when the film 2 is laser-processed to form the opening pattern 5.

Figure 4A:
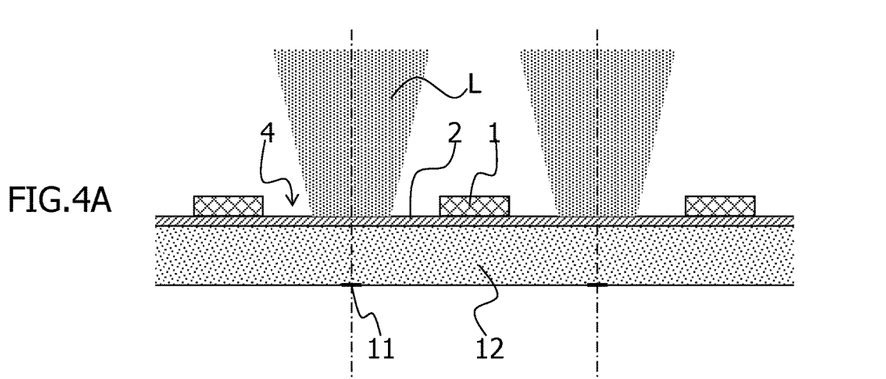
FIGS. 4A and 4B are sectional views for explaining a step of forming the opening pattern, illustrating a case in which there is no misalignment between a magnetic metal member of the deposition mask of the present invention and a reference substrate provided with a target for formation of the opening pattern.
Figure 4B:
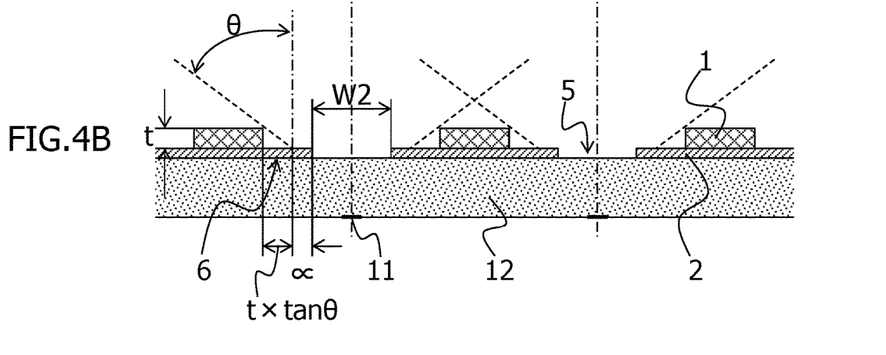

A part of the film 2 that corresponds to the reference pattern 11 is then irradiated with laser light L using an eximer laser of, for example, KrF 248 nm with a wavelength of, for example, 400 nm or less, and thus the film 2 is laser-processed. The stripe-shaped opening pattern 5 having a width W2 is hereby formed on the film 2 (see FIGS. 4A and 4B). In this case, the reference pattern 11 is imaged by an imaging camera to detect a position of the reference pattern 11 in advance, and based on the detection result, the reference substrate 12 side and a laser processing device (not illustrated) are relatively shifted to position laser light L on the reference pattern 11, followed by laser-processing the film 2. FIGS. 4A and 4B illustrate a case in which there is no positional deviation in alignment between the reference substrate 12 and the magnetic metal member 1. In this case, the opening pattern 5 is formed at the center of the through-hole 4 of the magnetic metal member 1, and effects of the deposition shadow can be eliminated during deposition as a matter of course.

Figure 5A:
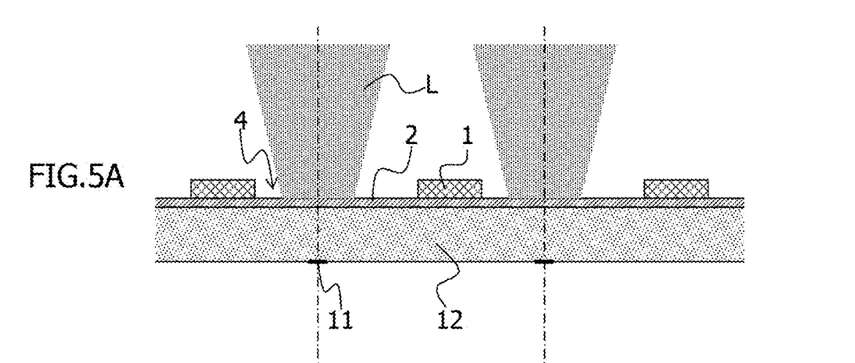
FIGS. 5A and 5B are sectional views for explaining a step of forming the opening pattern, illustrating a case in which there is misalignment within an allowable range between the magnetic metal member of the deposition mask of the present invention and a reference substrate provided with a target for formation of the opening pattern.
Figure 5B:
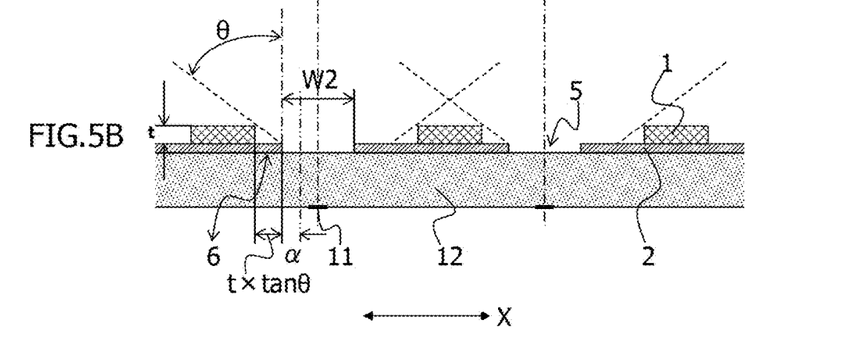

When alignment between the reference substrate 12 and the magnetic metal member 1 is deviated within the tolerance value $\alpha$ of positional deviation as shown in FIG. 5A, the position of the opening pattern 5 formed by laser processing is deviated in the X direction by up to $\alpha$ from the center of the through-hole 4 of the magnetic metal member 1 as shown in FIG. 5B. However, the through-hole 4 of the magnetic metal member 1 is formed so as to have a width W4 equal to $(W2+2\alpha+2t\times\tan\theta)$, and therefore, even though the amount of positional deviation of the opening pattern 5 is the tolerance limit $\alpha$, the opening pattern 5 is formed within a region surrounded by the deposition shadow region 6, so that effects on film formation by the deposition shadow can be eliminated during deposition.

In the above descriptions, a deposition mask for forming thin-film patterns with the thin-film patterns arranged at fixed array pitches is described, but the present invention is not limited thereto, and the thin-film patterns may be irregularly arranged. In this case, as long as the opening pattern 5 in the deposition mask is formed within the opening pattern formation region 7 surrounded by the deposition shadow region 6 that is defined by the thickness of the magnetic metal member 1 and the maximum angle $\theta$ of incidence of a deposition material to the surface of the film 2 in the through-hole 4, effects on film formation by the deposition shadow can be eliminated during deposition, so that a thin-film pattern having a uniform thickness can be formed.

It should be noted that the entire contents of Japanese Patent Application No. 2012-238956, filed on Oct. 30, 2012, on which convention priority is claimed, is incorporated herein by reference.

It should also be understood that many modifications and variations of the described embodiments of the invention will be apparent to one skilled in the art without departing from the spirit and scope of the present invention as claimed in the appended claims.

What is claimed is:
1. A deposition mask for forming a plurality of thin-film patterns by depositing material on a substrate, the plurality of thin-film patterns having a fixed array pitch in an arrangement direction, the deposition mask comprising:
 a magnetic metal member which is a plate that has through-holes arranged at a fixed array pitch in the arrangement direction, where the fixed array pitch of the through-holes of magnet metal member is set to the fixed array pitch of the plurality of the thin-film patterns; each of said through-holes having shaped and dimensions greater in the arrangement direction than those of a corresponding one of the thin-film patterns in the arrangement direction; and
 a resin film which is permeable to visible light and provided in contact with one surface of the magnetic metal member, the resin film having opening pattern, each of the opening patterns which has shape and dimensions identical to those of a corresponding one of the thin-film patterns and is formed at a position corresponding to one of the thin-film patterns in the through-hole by laser-processing the resin film through one of the through-holes of the magnetic metal member,
 wherein one of the opening patterns is provided within an opening pattern formation region surrounded by a deposition shadow region that is defined in the arrangement direction by the thickness of the magnetic metal member and a maximum angle of incidence of the deposition material to a surface of the resin film in the through-hole, wherein the width of the deposition shadow region in the arrangement direction is $t\times\tan\theta$ where t represents the thickness of the magnetic metal member, and $\theta$ represents the maximum angle of incidence of the deposition material to a normal line of the surface of the resin film; where the deposition shadow region included a portion of the resin film in the arrangement direction located between an end of the width of an area of the resin film between adjacent through-holes and a tolerance value $\alpha$ of positional deviation, where said tolerance value α of positional deviation refers to a width of an area in the arrangement direction located between the deposition shadow region and the opening pattern;

wherein the width W1 of the opening pattern formation region in the same direction as an arrangement direction of the through-holes is equal to a first value, W2+2α, obtained by adding a second value 2α that is twice as large as the tolerance value α of positional deviation of the opening pattern in the same direction as the arrangement direction of the through-holes, to at least the width W2 of the opening pattern in the same direction, where the opening pattern formation region comprises a region including one of the opening patterns and a portion of the resin film on both sides of the opening pattern including the tolerance value of the positional deviation located between the opening pattern and the deposition shadow region of the resin film on each side of the opening pattern, the positional deviation occurring while opening pattern is formed.

2. The deposition mask according to claim 1, wherein the width in the arrangement direction of the through-holes is equal to a third value $W1+2 \times t \times \tan \theta$ obtained by adding a fourth value $2 \times t \times \tan \theta$ that is twice as large as the width $t \times \tan \theta$ of the deposition shadow region in the same direction as the arrangement direction of the through-holes, to the width W1 of the opening pattern formation region in the same direction as the arrangement direction of the through-holes.

3. The deposition mask according to claim 1, wherein the magnetic metal member is made of nickel, a nickel alloy, Invar, or an Invar alloy.

4. The deposition mask according to claim 1, wherein the resin film is made of polyimide.

5. The deposition mask according to claim 1, wherein one end surface of a frame provided with an opening sized to include the through-hole is bonded to a peripheral edge region of one surface of the magnetic metal member.

\* \* \* \* \*